US010529621B2

(12) United States Patent
Quon et al.

(10) Patent No.: US 10,529,621 B2
(45) Date of Patent: Jan. 7, 2020

(54) MODULATING THE MICROSTRUCTURE OF METALLIC INTERCONNECT STRUCTURES

(71) Applicant: International Business Machines Corporation, Armonk, NY (US)

(72) Inventors: Roger A. Quon, Rhinebeck, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/267,695

(22) Filed: Feb. 5, 2019

(65) Prior Publication Data

US 2019/0172747 A1 Jun. 6, 2019

Related U.S. Application Data

(62) Division of application No. 15/443,583, filed on Feb. 27, 2017, now Pat. No. 10,249,532.

(51) Int. Cl.
*H01L 21/67* (2006.01)
*H01L 21/768* (2006.01)
(Continued)

(52) U.S. Cl.
CPC ...... *H01L 21/76882* (2013.01); *C23C 14/046* (2013.01); *C23C 14/568* (2013.01);
(Continued)

(58) Field of Classification Search
CPC ............... H01L 21/76882; H01L 21/67; H01L 21/76849; H01L 21/76802;
(Continued)

(56) References Cited

U.S. PATENT DOCUMENTS 6,508,920 B1   1/2003   Ritzdorf et al.
6,855,648 B2   2/2005   Huang et al.
(Continued)

OTHER PUBLICATIONS

C.-C. Yang et al., "Thermal Stress Control in Cu Interconnects," IEEE International Interconnect Conference/Advanced Metallization Conference (IITC/AMC), May 20-23, 2014, pp. 253-256.
(Continued)

*Primary Examiner* — Kyoung Lee
(74) *Attorney, Agent, or Firm* — Vazken Alexanian; Ryan, Mason & Lewis, LLP

(57) ABSTRACT

Tooling apparatus and methods are provided to fabricate semiconductor devices in which controlled thermal annealing techniques are utilized to modulate microstructures of metallic interconnect structures. For example, an apparatus includes a single platform semiconductor processing chamber having first and second sub-chambers. The first sub-chamber is configured to receive a semiconductor substrate comprising a metallization layer formed on a dielectric layer, wherein a portion of the metallization layer is disposed within an opening etched in the dielectric layer, and to form a stress control layer on the metallization layer. The second sub-chamber comprises a programmable hot plate which is configured to perform a thermal anneal process to modulate a microstructure of the metallization layer while the stress control layer is disposed on the metallization layer, and without an air break between the process modules of forming the stress control layer and performing the thermal anneal process.

20 Claims, 8 Drawing Sheets

(51) Int. Cl.

| | | |
|---|---|---|
| *C23C 16/56* | (2006.01) | |
| *C23C 14/58* | (2006.01) | |
| *C23C 14/04* | (2006.01) | |
| *C23C 14/56* | (2006.01) | |
| *C23C 16/04* | (2006.01) | |
| *C23C 16/06* | (2006.01) | |
| *C23C 16/34* | (2006.01) | |
| *C23C 16/455* | (2006.01) | |
| *C23C 16/50* | (2006.01) | |
| *C23C 18/52* | (2006.01) | |

(52) U.S. Cl.
CPC ...... *C23C 14/5806* (2013.01); *C23C 14/5873* (2013.01); *C23C 16/045* (2013.01); *C23C 16/06* (2013.01); *C23C 16/34* (2013.01); *C23C 16/45544* (2013.01); *C23C 16/50* (2013.01); *C23C 16/56* (2013.01); *C23C 18/52* (2013.01); *H01L 21/67* (2013.01)

(58) Field of Classification Search
CPC ............ C23C 14/5806; C23C 14/5873; C23C 14/046; C23C 14/568; C23C 16/045; C23C 16/56
See application file for complete search history.

(56) References Cited

U.S. PATENT DOCUMENTS

| | | |
|---|---|---|
| 7,192,494 B2 | 3/2007 | Chen et al. |
| 7,352,065 B2 | 4/2008 | Dorfman |
| 7,396,480 B2 | 7/2008 | Kao et al. |
| 8,420,537 B2 | 4/2013 | Chanda et al. |
| 8,481,432 B2 | 7/2013 | Mayer et al. |
| 2005/0205110 A1 | 9/2005 | Kao et al. |
| 2005/0260345 A1* | 11/2005 | Lubomirsky ....... C23C 18/1619 427/240 |
| 2006/0160372 A1 | 7/2006 | Dorfman |
| 2009/0120799 A1 | 5/2009 | Sun et al. |
| 2011/0223772 A1 | 9/2011 | Mayer et al. |
| 2015/0206840 A1 | 7/2015 | Lin et al. |
| 2016/0133573 A1 | 5/2016 | He et al. |

OTHER PUBLICATIONS

C.-C. Yang et al., "Microstructure Modulation in Copper Interconnects," IEEE Electron Device Letters, May 2014, pp. 572-574, vol. 35, No. 5.

C.-C. Yang et al., "Enhanced Electromigration Resistance Through Grain Size Modulation in Copper Interconnects," China Semiconductor Technology International Conference (CSTIC), Mar. 15-16, 2015, 5 pages.

C.-C. Yang et al., "Effects of Metal Capping on Thermal Annealing of Copper Interconnects," IEEE Electron Device Letters, Jul. 2012, pp. 1051-1053, vol. 33, No. 7.

C.-C. Yang et al., "Stress Control During Thermal Annealing of Copper Interconnects," Applied Physics Letters, Jan. 2011, 3 pages, vol. 98, No. 5.

Y.A. Wahab et al., "Reduction of Annealed-Induced Wafer Defects in Dual-Damascene Copper Interconnects," Microelectronics Reliability, Sep. 2012, pp. 1975-1980, vol. 52.

* cited by examiner

400

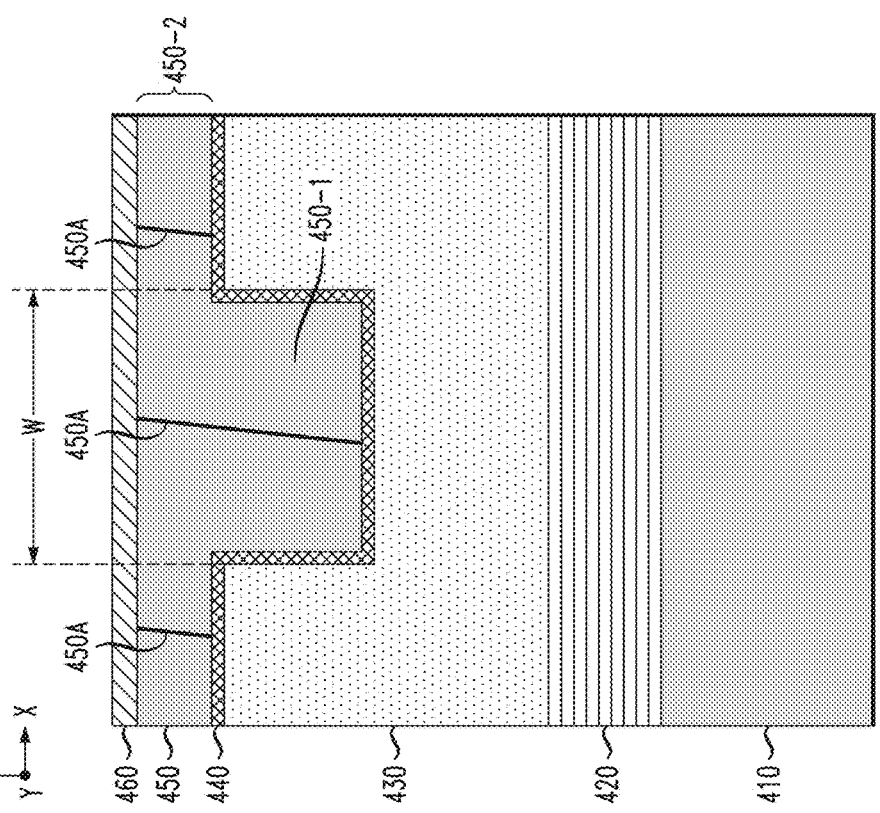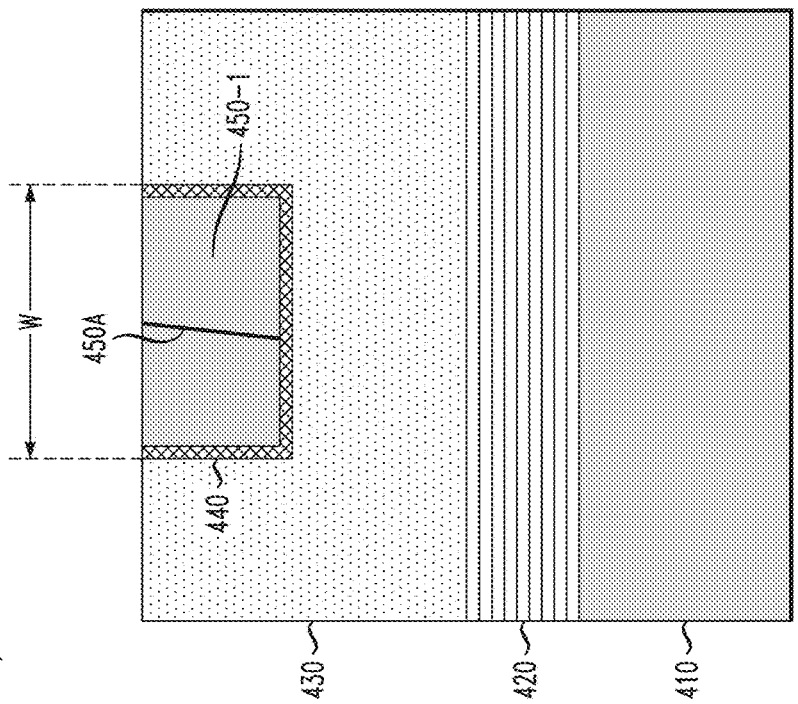

MODULATING THE MICROSTRUCTURE OF METALLIC INTERCONNECT STRUCTURES

TECHNICAL FIELD

This disclosure generally relates to semiconductor fabrication techniques and, in particular, tooling related techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance in the BEOL interconnect structure, resulting in improved conduction and higher performance. As copper interconnect structures are scaled down, however, there are significant increases in the resistivity and current density within the copper interconnect structures, which is undesirable. The increased current density in copper interconnect structures causes increased current-driven electromigration of copper atoms. In the context of copper interconnect structures, electromigration is the transport of the copper atoms caused by the gradual movement of ions in the copper material due to momentum transfer between conducting electrons and diffusing copper atoms. The electromigration of copper atoms can lead to various defects in copper interconnect structures such as voids and hillock defects.

The electrical conductivity and electromigration properties of a metallic interconnect depend, in part, on a grain microstructure of the metallic material which forms the metallic interconnect. For example, a polycrystalline microstructure is one which comprises many crystallites (or grains) of varying size and orientation, and with random texture and no grain direction. A polycrystalline microstructure tends to decrease the electrical conductivity of the metallic material, as well as increase electromigration within the metallic material due to the electron diffusion paths that exist along the various grain boundaries in the polycrystalline microstructure of the metallic material. In this regard, metallization layers are typically subjected to a thermal annealing process in which the metallic material is thermally annealed to promote recrystallization and grain growth of the microstructure of the metallic material, wherein the grain growth lowers energy by reducing grain boundary area, and the recrystallization lowers energy by eliminating mechanically strained grains. Since recrystallization and grain growth are both thermally activated processes involving atomic diffusion, it is desirable to anneal the metallic material at higher temperatures so as to reduce the anneal process time. However, it has been found that high temperature anneals can result in degraded interconnect reliability due to a phenomenon known as "stress voiding."

In general, stress voiding occurs within a metallic interconnect as a result of thermal stress generation and relaxation during the thermal anneal process, which causes stress gradients within the metallic interconnect. In particular, during a thermal anneal process, significant compressive stress can be induced on metallic material within an etched opening in a dielectric layer due to coefficient of thermal expansion (CTE) mismatch between the CTE of the metallic material and the CTE of the surrounding dielectric material. When annealing a copper metallic interconnect at elevated temperatures, such as around 300 degrees C. and higher, an increasing compressive force is applied to the metallic material until a "stress relaxation point" is reached at a critical temperature, causing an increase in the atomic diffusion of the metallic material along the grain boundaries and towards a free surface of the metallic material to relieve the compressive stress. This atomic diffusion results in the formation of hillock defects on the free surface of the metallic material, as well as the formation of voids within lower regions of the metallic interconnect as the metallic interconnect is cooled. In this regard, the metallic interconnect is subjected to large tensile stresses as it cools to lower temperatures, resulting in the formation of stress voids within the metallic material at normal device operating temperatures. The formation of hillock defects and stress voids degrade the performance and reliability of metallic interconnect structures.

SUMMARY

Embodiments of the invention include tooling apparatus and methods for fabricating semiconductor devices in which controlled thermal annealing techniques are utilized to modulate microstructures of metallic interconnect structures. For example, in one embodiment, an apparatus comprises a single platform semiconductor processing chamber comprising a first sub-chamber and a second sub-chamber. The first sub-chamber is configured to (i) receive a semiconductor substrate comprising a layer of metallic material formed on a dielectric layer, wherein a portion of the layer of metallic material is disposed within an opening etched in the dielectric layer, and to (ii) form a stress control layer on the layer of metallic material. The second sub-chamber comprises a programmable hot plate. The second sub-chamber is configured to perform a thermal anneal process using the programmable hot plate to modulate a microstructure of the layer of metallic material from a first microstructure to a second microstructure while the stress control layer is disposed on the layer of metallic material. The programmable hot plate is programmed to perform a controlled thermal anneal cycle with active heating and active cooling periods.

Another embodiment includes a method to fabricate a semiconductor device. The method comprises: forming a dielectric layer on a substrate; patterning the dielectric layer to form an opening in the dielectric layer; depositing a layer of metallic material on the dielectric layer to fill the opening with metallic material; forming a stress control layer on the layer of metallic material; and performing a thermal anneal process to modulate a microstructure of the deposited layer of metallic material from a first microstructure to a second microstructure while the stress control layer is disposed on the layer of metallic material. The thermal anneal process is performed using a programmable hot plate which is programmed to perform a controlled thermal anneal cycle with active heating and active cooling periods. The thermal anneal process is performed without an air break between the steps of forming the stress control layer and performing the thermal anneal process.

Other embodiments will be described in the following detailed description of embodiments, which is to be read in conjunction with the accompanying figures.

BRIEF DESCRIPTION OF THE DRAWINGS

FIGS. 4 through 12 schematically illustrate a semiconductor device at different stages of fabrication using the method of FIG. 3, according to an embodiment of the invention, wherein:

FIG. 4 is a cross-sectional schematic side view of the semiconductor device at an intermediate stage of fabrication after depositing an interlevel dielectric (ILD) layer on a substrate;

FIG. 5 is a cross-sectional schematic side view of the semiconductor device of FIG. 4 after etching an opening in the ILD layer;

FIG. 6 is a cross-sectional schematic side view of the semiconductor structure of FIG. 5 after depositing a layer of liner material to cover sidewall and bottom surfaces of the opening in the ILD layer with the liner material;

FIG. 7 is a cross-sectional schematic side view of the semiconductor structure of FIG. 6 after depositing a layer of metallic material to fill the opening in the ILD layer with metallic material, wherein the layer of metallic material as deposited comprises a polycrystalline microstructure;

FIG. 8 is a cross-sectional schematic side view of the semiconductor structure of FIG. 7 after performing a thermal anneal process to reflow the layer of metallic material;

FIG. 9 is a cross-sectional schematic side view of the semiconductor structure of FIG. 8 after depositing a stress control layer on an upper surface of the layer of metallic material;

FIG. 10 is a cross-sectional schematic side view of the semiconductor structure of FIG. 9 after applying a controlled thermal annealing process to cause recrystallization and grain growth of the layer of metallic material;

FIG. 11 is a cross-sectional schematic side view of the semiconductor structure of FIG. 10 after removing the stress control layer and planarizing the surface of the semiconductor structure down to the ILD layer to form a metal interconnect structure in the ILD layer; and FIG. 12 is a cross-sectional schematic side view of the semiconductor structure of FIG. 11 after depositing a layer of insulating material on the planarized surface of the ILD layer to form a capping layer.

DETAILED DESCRIPTION

Figure 1:
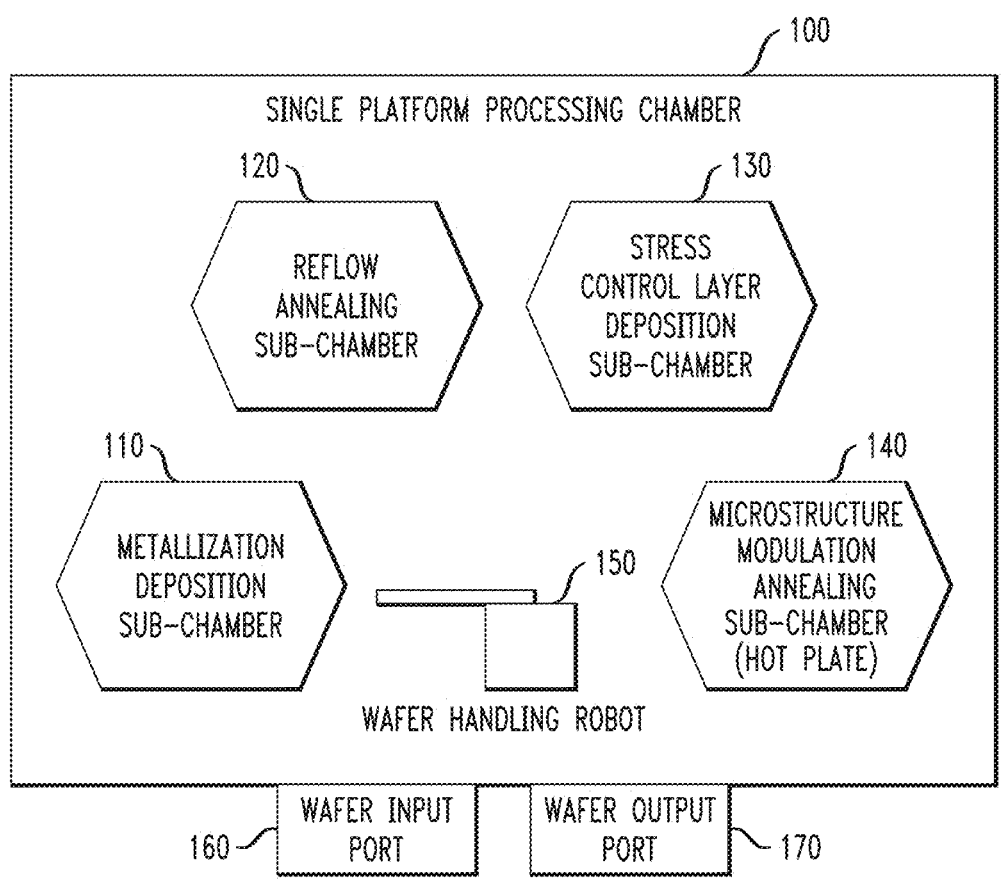
FIG. 1 schematically illustrates a tooling apparatus comprising a single platform semiconductor processing chamber for modulating a microstructure of a metallic interconnect structure, according to an embodiment of the invention.

Embodiments of the invention will now be discussed in further detail with regard to tooling apparatus and methods for fabricating semiconductor devices in which controlled thermal annealing techniques are utilized to modulate microstructures of metallic interconnect structures. It is to be understood that the various devices, modules, layers, structures, and regions shown in the accompanying drawings are schematic illustrations that are not drawn to scale. In addition, for ease of explanation, layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular system components, materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context, XYZ Cartesian coordinates are shown in certain drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

In one embodiment of the invention, a tooling apparatus comprises a single platform semiconductor processing chamber comprising a first sub-chamber and a second sub-chamber. The first sub-chamber is configured to receive a semiconductor substrate (e.g., semiconductor wafer) comprising a metallization layer (e.g., copper) formed on a dielectric layer (e.g., ILD layer), wherein a portion of the metallization layer is disposed within an opening (e.g., single or dual damascene opening) etched in the dielectric layer. The first sub-chamber is further configured to form a stress control layer on the metallization layer. The second sub-chamber comprises a programmable hot plate which is configured to perform a programmatically controlled thermal anneal process to modulate a microstructure of the metallization layer while the stress control layer is disposed on the metallization layer, and without an air break between formation of the stress control layer and the thermal anneal process. In one embodiment, the thermal anneal process is performed to modulate a microstructure of the metallization layer from a first microstructure (e.g., polycrystalline structure) to a second microstructure (e.g., a large grain microstructure such as a columnar microstructure) while the stress control layer is disposed on the metallization layer.

In one embodiment of the invention, stress control techniques using stress control layers as described herein can be implemented using the same or similar methods as disclosed in U.S. Pat. No. 8,420,537, entitled "Stress Locking Layer for Reliable Metallization," which is commonly owned and fully incorporated herein by reference. As disclosed in U.S. Pat. No. 8,420,537, prior to thermal annealing a metallization layer, a stress control layer can be formed on a free surface of the metallization layer to control stress by, e.g., reducing compressive stress relaxation of the metallization layer during a subsequent thermal anneal process which can be performed at substantially high anneal temperatures for short or relatively long anneal times to enable recrystallization and grain growth of the metallization layer. The stress control layer serves to extend an elastic region of the metallization layer (under compressive stress and high anneal temperatures) by suppressing atom diffusion of metallic material to the free surface, which results in near zero tensile stress in the metallization at room temperature after the thermal anneal, and which prevents or substantially minimizes stress voiding defects that degrade interconnect reliability.

In accordance with embodiments of the invention, the process modules of (i) forming a stress control layer on a surface of a metallization layer and (ii) performing a thermal anneal of the metallization layer (with the stress control layer on the surface thereof) are performed in sequence in a single platform system with no air break in between the two process modules. Experimental results have shown that this process sequence with no air break enhances the effectiveness of the stress control layer to prevent or substantially suppress compressive stress relaxation (and thus prevent or substantially reduce stress void formation) in a metallization layer during a subsequent anneal with anneal temperatures up to 800 degrees C. for relatively short or long periods of time (e.g., 30 seconds to 5 hours). With conventional methods where there is an air break between stress control deposition and thermal anneal, the stress control layer can be oxidized during the air break, and oxidation of the stress control layer substantially alters the material properties of the stress control layer including modules and relative stress to the underlying metallization layer, and thus degrades the effectiveness of the stress control layer. In addition, embodiments of the invention provide a tightly controlled queue time between a stress control layer deposition process module and a thermal annealing process module, which (as experiments have shown) further serves to enhance the effectiveness of the stress control layer in minimizing the amount of compressive stress relaxation during thermal anneal of the metallization layer by extending the "stress relaxation point" of the metallization layer to higher compressive forces and higher critical anneal temperatures, as compared to conventional techniques for thermal annealing metallization layers with stress control layers.

Furthermore, embodiments of the invention perform thermal annealing using a programmable hot plate to provide tightly controlled annealing cycles with custom programmed ramp-up heating rates, ramp-down cooling rates, and soaking times. In this regard, the use of a programmable hot plate to thermally anneal a metallization layer at optimal temperature levels and ramp-up and ramp-down rates, enables the customized microstructure modulation of metallic interconnect structures.

FIG. 1 schematically illustrates a tooling apparatus comprising a single platform system for modulating a microstructure of a metallic interconnect structure, according to an embodiment of the invention. In particular, FIG. 1 schematically illustrates a single platform processing chamber 100 comprising a plurality of sub-chambers 110, 120, 130, and 140, a wafer handling robot 150, a wafer input port 160, and a wafer output port 170. In the example embodiment shown in FIG. 1, the sub-chambers comprise a metallization deposition sub-chamber 110, a metal reflow annealing sub-chamber 120, a stress control layer (SCL) deposition sub-chamber 130, and a microstructure modulation annealing sub-chamber 140.

The wafer input port 160 and the wafer output port 170 provide input and output ports to move semiconductor wafers into and out of the single platform processing chamber 100. The wafer loading port 160 is configured to hold a plurality of semiconductor wafers that are to be processed within the single platform processing chamber 100. The wafer handling robot 150 is disposed within the single platform processing chamber 100 and is configured to obtain a semiconductor wafer from the wafer input port 160 and move the semiconductor wafer to each sub-chamber 110, 120, 130 and 140, in sequence, wherein a sequence of in-situ processes associated with the sub-chambers 110, 120, 130 and 140 are performed within the single platform processing chamber 100. When the in-situ processing of a given semiconductor wafer is complete, the wafer handling robot 150 places the processed semiconductor wafer into the wafer output port 170, wherein the semiconductor wafer can be accessed for further processing in one or more separate processing chambers.

In one embodiment of the invention, the semiconductor wafers that are loaded into the wafer input port 160 each comprise an intermediate BEOL structure with an ILD layer having a pattern of trenches and/or via openings (e.g., single damascene or dual damascene openings) etched in the surface of the ILD layer, which are to be filled with metallization. As an initial stage in the fabrication of metallic interconnects for the given BEOL layer, the metallization deposition sub-chamber 110 is configured to deposit metallic material to fill the trenches and/or via openings in the ILD layer. In one embodiment, the metallization deposition sub-chamber 110 is configured to implement dry deposition methods (e.g., atomic layer deposition (ALD), chemical vapor deposition (CVD), physical vapor deposition (PVD), etc.) to deposit one or more liner layers to line the surfaces of the trenches and/or via openings, followed by deposition of a metallization layer to fill the trenches and/or via openings in the patterned ILD layer with metallic material that is subsequently process to form metallic interconnect structures. In other embodiment, the metallization deposition sub-chamber 110 is configured to deposit metallic material in the trenches and/or via openings in the ILD layer using wet deposition methods such as electroplating, electroless plating, etc.

The reflow annealing sub-chamber 120 is an optional process module that is configured to perform a metal reflow process by implementing thermal annealing to reflow a layer of metallic material previously deposited in the metallization deposition sub-chamber 110. The metal reflow process serves to remove voids or seams in a layer of metallic material that is deposited in the metallization deposition sub-chamber 110, or otherwise allow a reflow of the layer of metallic material to properly fill trench and via features with high aspect ratios and small lateral dimensions. In one embodiment, the reflow annealing sub-chamber 120 comprises a furnace to perform a thermal annealing process in a suitable gas atmosphere (e.g., mixture of hydrogen and nitrogen) to reflow a deposited layer of metallic material at a relatively low temperature (e.g., about 300 degrees Celsius). The reflow process allows the layer of metallic material on the top surface of the ILD layer and on the sidewall surfaces of the opening to diffuse/flow towards a bottom of opening (e.g., via hole below a trench opening) and continue to fill the opening from the bottom up.

The SCL deposition sub-chamber 130 is configured to deposit a stress control layer on the layer of metallic material that is previously deposited in the metallization deposition sub-chamber 110 (and optionally reflowed in the reflow annealing sub-chamber 120). In one embodiment, the SCL deposition sub-chamber 130 implements a dry deposition method (e.g., ALD, CVD, PVD, etc.) to deposit a stress control layer formed of one or more materials, including, but not limited to, tantalum (Ta), tantalum nitride (TaN), titanium (Ti), titanium nitride (TiN), tungsten (W), tungsten nitride (WN), cobalt (Co), cobalt tungsten phosphide (CoWP), ruthenium (Ru), ruthenium nitride (RuN), ruthenium (Ru), ruthenium nitride (RuN), iridium (Ir), rhodium (Rh), manganese (Mn), or nickel (Ni), or alloys of such materials. In another embodiment, the SCL deposition sub-chamber 130 implements a wet deposition method such as electroplating, electroless plating, etc.

Figure 2:
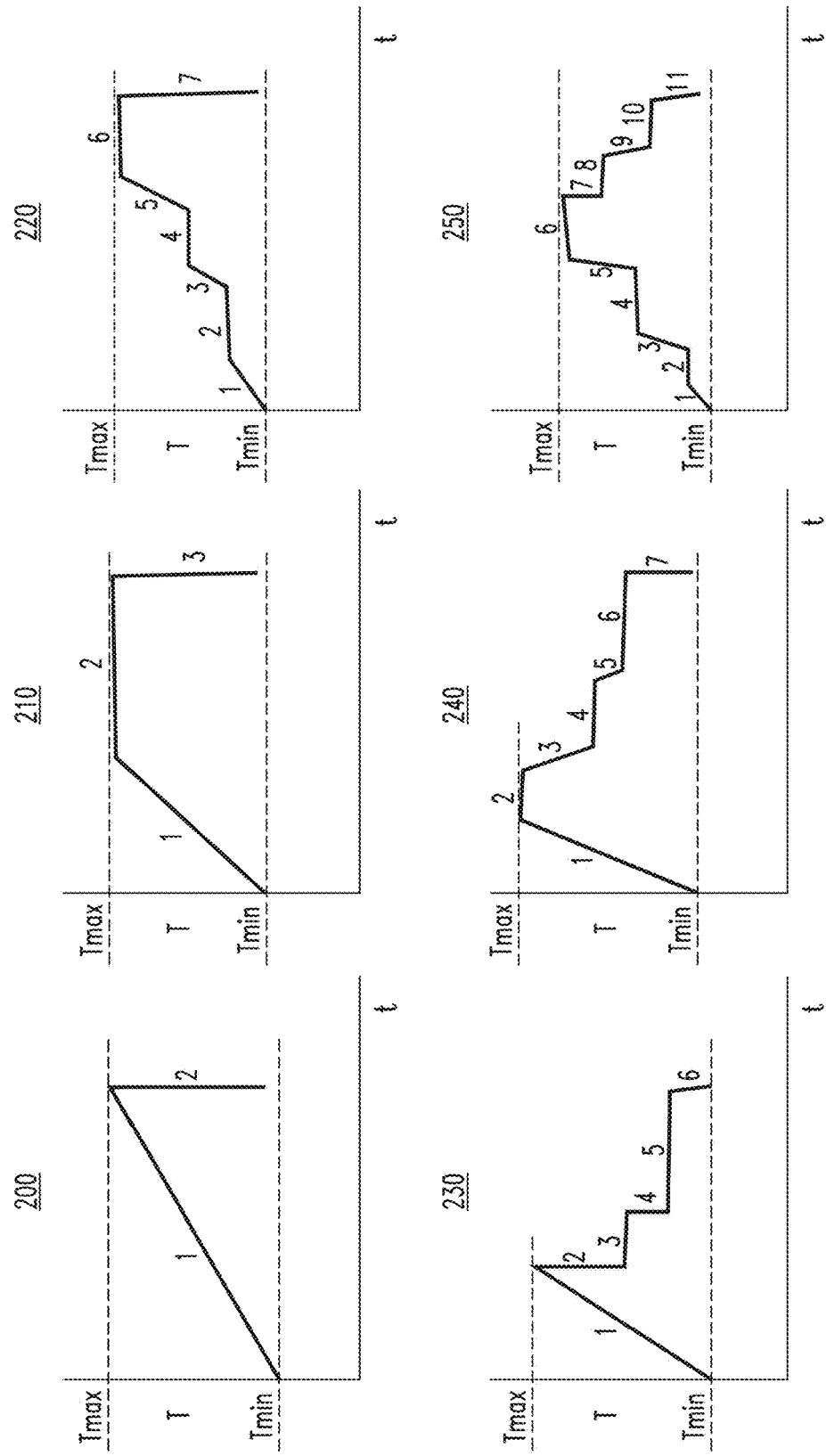
FIG. 2 graphically illustrates example profiles of controlled thermal anneal cycles which can be implemented using a programmable hot plate in the tooling apparatus of FIG. 1 to modulate a microstructure of a metallic interconnect structure, according to alternate embodiments of the invention.

The microstructure modulation annealing sub-chamber 140 is configured perform an in-situ thermal annealing process of a metallization using a programmable hot plate to cause recrystallization and grain growth of the metallization layer, with the SCL layer in place on the metallization layer. In particular, the microstructure modulation annealing sub-chamber 140 utilizes a programmable hot plate to perform a controlled thermal annealing process in a suitable gas atmosphere (e.g., mixture of hydrogen ($H_2$), helium (He), nitrogen ($N_2$), or a mixture thereof) to custom modulate the microstructure of the deposited layer of metallic material using a custom programmed thermal annealing profile, examples of which are shown in FIG. 2. As noted above, the process of performing a thermal anneal process, in situ (without an air break), at some controlled period of time after depositing the SCL layer at enables better stress control with minimal or no compressive stress relaxation at high anneal temperatures that may be used to modulate the grain structure of the metallization layer to a target grain size and orientation, while minimize internal stresses and stress voids in the metallization post anneal.

FIG. 2 graphically illustrates example profiles of controlled thermal anneal cycles which can be implemented using a programmable hot plate in the tooling apparatus of FIG. 1 to modulate a microstructure of a metallic interconnect structure, according to alternate embodiments of the invention. In particular FIG. 2 graphically illustrates different thermal annealing profiles 200, 210, 220, 230, 240 and 250 which can be used to program a hot plate within the microstructure modulation annealing sub-chamber 140 of FIG. 1 to custom modulate the microstructure of a target layer of metallic material with a stress control layer disposed thereon. The thermal annealing profiles 200, 210, 220, 230, 240 and 250 graphically illustrate a temperature T setting (vertical axis) of a programmable hot plate as a function of time t (horizontal axis), wherein the temperature T setting falls within a minimum temperature setting (Tmin) and a maximum temperature setting (Tmax). In one embodiment, the parameter Tmin is about 0 degrees Celsius or greater, and the parameter Tmax is about 800 degrees Celsius or less. Moreover, in one embodiment, the total annealing time of the thermal annealing profiles 200, 210, 220, 230, 240 and 250 can be in a range from about 30 seconds to about 5 hours, depending on the types of metallic materials used, the target microstructure desired, the target anneal temperature(s), etc.

The thermal annealing profiles 200, 210, 220, 230, 240 and 250 provide different examples of programmed anneal cycles with active heating and active cooling periods to provide controlled thermal annealing at different ramp-up rates, soak times, and cool-down rates, at different temperatures and at different times during a given thermal anneal cycle. For example, the thermal annealing profile 200 illustrates an example thermal anneal cycle in which the temperature setting T of a programmed hot plate continually increases over the entire anneal cycle from a Tmin setting to a Tmax setting, as illustrated by the ramp-up period (1). When the temperature T reaches Tmax, near the end of the thermal anneal cycle, the temperature T of the programmable hot plate is dropped down to about the initial temperature Tmin, as illustrated by the ramp-down period (2). In one example embodiment, the ramp-down period (2) of the thermal anneal profile 200 is shown as a vertical line, such that the temperature T setting of the hot plate changes from Tmax to Tmin at the end of the thermal anneal cycle.

The thermal annealing profile 210 illustrates an example thermal anneal cycle which has three different anneal periods over the course of the complete thermal anneal cycle. In particular, the three periods of the thermal annealing profile 210 include a ramp-up period (1) from Tmin to Tmax, and a soak-time period (2) at Tmax (which occur during a heating period of the example thermal anneal cycle), followed by a ramp-down period (3) during a cooling period at the end of the thermal anneal cycle.

Next, the thermal annealing profile 220 of FIG. 2 illustrates an example thermal anneal cycle which comprises seven different anneal periods over the course of the complete thermal anneal cycle. In particular, the thermal annealing profile 220 includes multiple ramp-up periods (1), (3) and (5), as well as two intervening soak-time periods (2) and (4), which occur during the heating period of the thermal anneal cycle from Tmin to Tmax. In addition, the heating period comprise a soak-time period (6) at Tmax, which is maintained for a given period of time. The soak-time period (6) is followed by a ramp-down period (7) at the end of the thermal anneal cycle.

Further, the thermal annealing profile 230 of FIG. 2 illustrates an example thermal anneal cycle which has six different anneal periods over the course of the complete thermal anneal cycle. In particular, the thermal annealing profile 230 include a ramp-up period (1) from Tmin to Tmax, which occurs during a heating period of the thermal anneal cycle. In addition, the thermal annealing profile 230 includes multiple ramp-down periods (2), (4) and (6), as well as two intervening soak-time periods (3) and (5) (or low rate ramp down periods), which occur during a controlled cool down period of the thermal anneal cycle from Tmax to Tmin.

Next, the thermal annealing profile 240 of FIG. 2 illustrates an example thermal anneal cycle which has seven different anneal periods over the course of the complete thermal anneal cycle. In particular, the thermal annealing profile 240 include a ramp-up period (1) from Tmin to Tmax, and a soak-time period (2) at Tmax. In addition, the thermal annealing profile 240 includes multiple ramp-down periods (3), (5) and (7), as well as two intervening soak-time periods (4) and (6), which occur during the cool down period of the thermal anneal cycle from Tmax to Tmin.

Lastly, the thermal annealing profile 250 of FIG. 2 illustrates an example thermal anneal cycle which has 11 different anneal periods over the course of the complete thermal anneal cycle. In particular, the thermal annealing profile 250 includes multiple ramp-up periods (1), (3), (5) and (6), and intervening soak-time periods (2) and (4), which occur during a heat-up period from Tmin to Tmax. In addition, the thermal annealing profile 250 includes multiple ramp-down periods (7), (9) and (11), as well as two intervening soak-time periods (8) and (10), which occur during the cool down period of the thermal anneal cycle from Tmax to Tmin.

It is to be understood that the thermal annealing profiles 200, 210, 220, 230, 240 and 250 shown in FIG. 2 are just a few examples of different thermal annealing cycles that can be used to programmatically control the temperature settings of a programmable hot plate that is implemented in the microstructure modulation annealing sub-chamber 140 to perform a controlled thermal anneal process. Indeed, other annealing profiles can be implemented using a programmable hot plate, which have a wide variety of different combinations of ramp-up, soak time, and ramp-down periods at different temperatures, times and rates. The use of a programmable hot plate enables periods of ramp-up heating in which a temperature setting of the programmable hot plate can be programmed to automatically increase at a rate of about 10° C./min or more, which is significantly greater than the ramp-up heating rates that can be achieved using a thermal anneal furnace. In addition, the use of a programmable hot plate enables active cooling periods during the thermal anneal cycle in which a temperature setting of the programmable hot plate can be programmed to automatically decrease at a rate of about 2° C./min or more to "lock-in" a modified microstructure, if necessary, while preventing the stress migration and stress voiding that can occur with the limited slower cooling rates that are achieved using conventional thermal annealing techniques. In another example embodiment, a controlled thermal anneal cycle can be designed to have at least one heat soaking period in which a temperature setting of the programmable hot plate is maintained constant for a period of time at a temperature level which is below a critical temperature of the layer of metallic material at which compressive stress relaxation of the metallic material occurs during a heating period of the controlled thermal anneal cycle.

In one embodiment of the invention, the single platform processing chamber 100 may further comprise a laser interferometer system to determine the wafer stress state of a semiconductor wafer during a thermal annealing process implemented in the microstructure modulation annealing sub-chamber 140. The wafer stress state can be detected and analyzed to adjust the temperature set point(s) for ramp-up rates, ramp-down rates, and/or soak times, as well as other thermal annealing conditions within the microstructure modulation annealing sub-chamber 140 to minimize or prevent internal stresses that may exist in the metallic interconnect structures over the course of a given anneal cycle. This allows for the design and optimization of custom thermal anneal cycles for target semiconductor structures and materials that are used for the BEOL fabrication.

Various methods for fabricating a metallic interconnect structure within a BEOL layer of a semiconductor device and modulating a microstructure of the metallic interconnect structure will now be discussed in further detail with reference to the flow diagram of FIG. 3. For illustrative purposes, the methods of FIG. 3 will be discussed in the context of the single platform processing chamber 100 of FIG. 1, as well as FIGS. 4 through 12, which schematically illustrate a semiconductor device at different stages of fabrication using the method of FIG. 3, according to embodiments of the invention.

Figure 3:
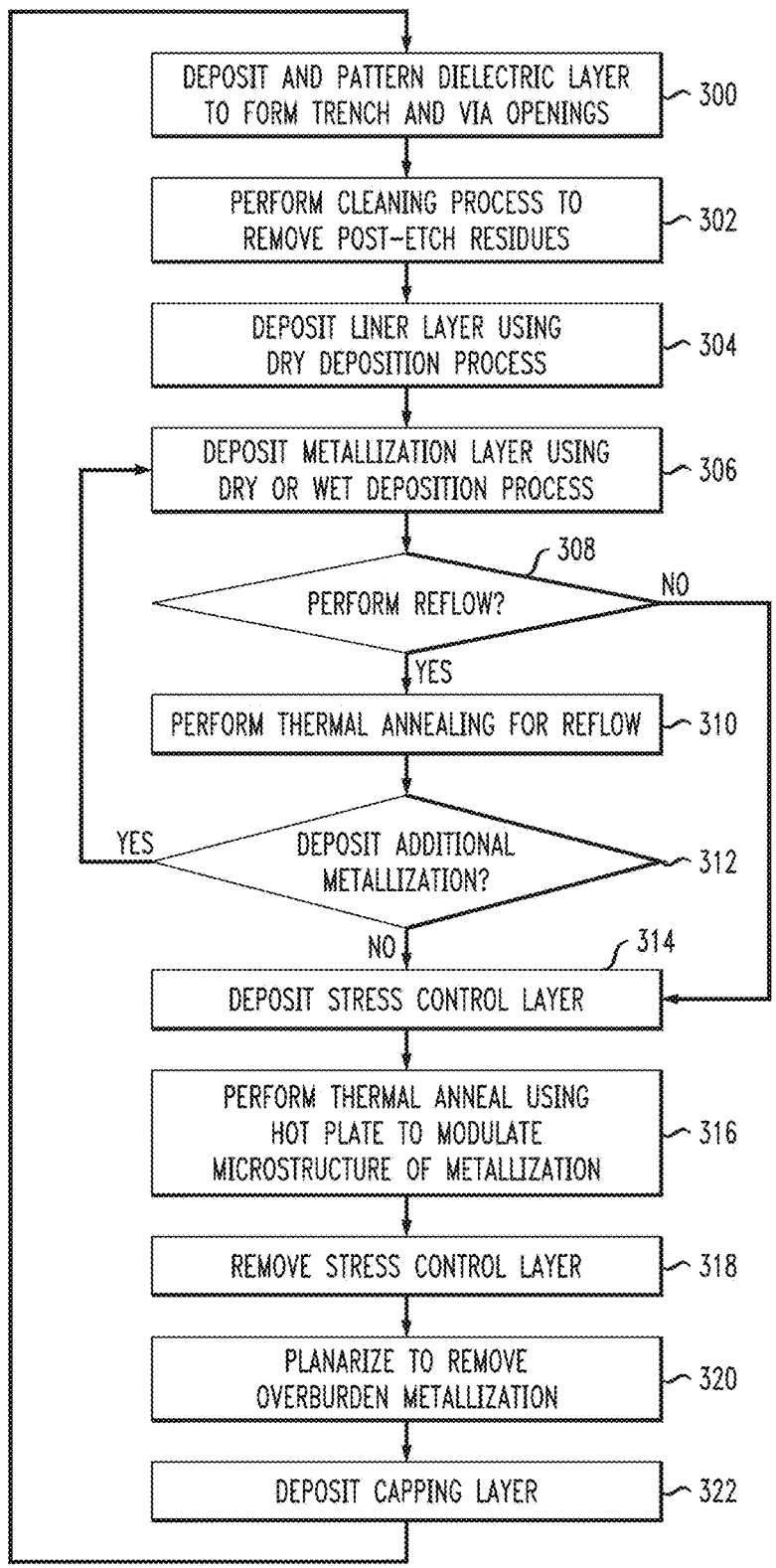
FIG. 3 is a flow diagram of a method for fabricating a metallic interconnect structure within a BEOL layer of a semiconductor device and modulating a microstructure of the metallic interconnect structure, according to an embodiment of the invention.
Figure 5:
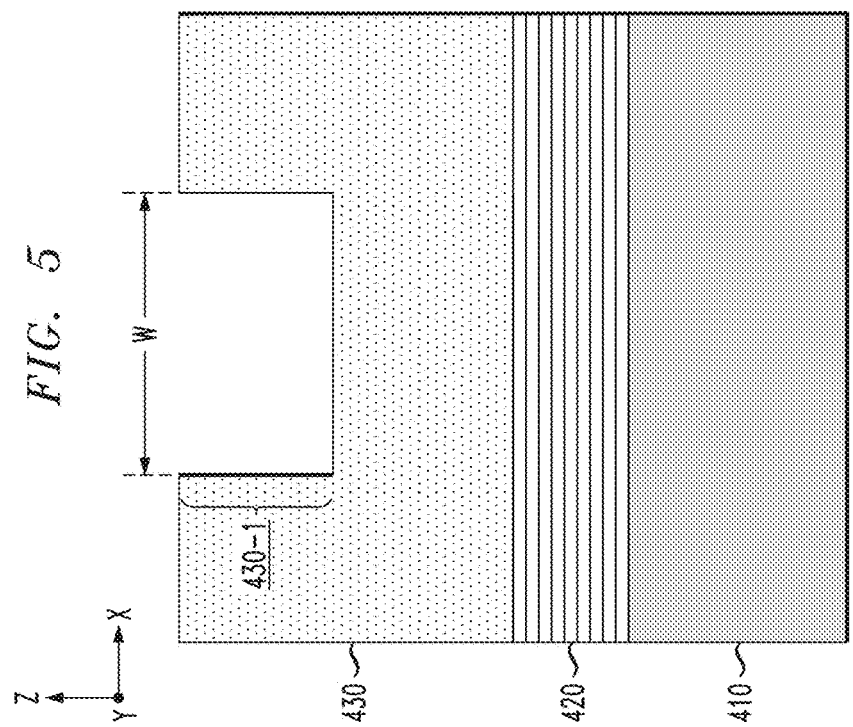

Referring to FIG. 3, at an intermediate stage of fabricating a semiconductor device, a layer of dielectric material (e.g., ILD layer), which is part of a BEOL layer, is deposited on a substrate and patterned to form trenches and/or via openings (block 300), and a cleaning process is performed to remove post-etch residues from the etch surfaces of the ILD layer (block 302). In one embodiment of the invention, the process steps of blocks 300 and 302 are performed in a semiconductor processing chamber which is separate from, and not included in, the single platform processing chamber 100 of FIG. 1. The process steps of blocks 300 and 302 are schematically illustrated in FIGS. 4 and 5.

Figure 4:
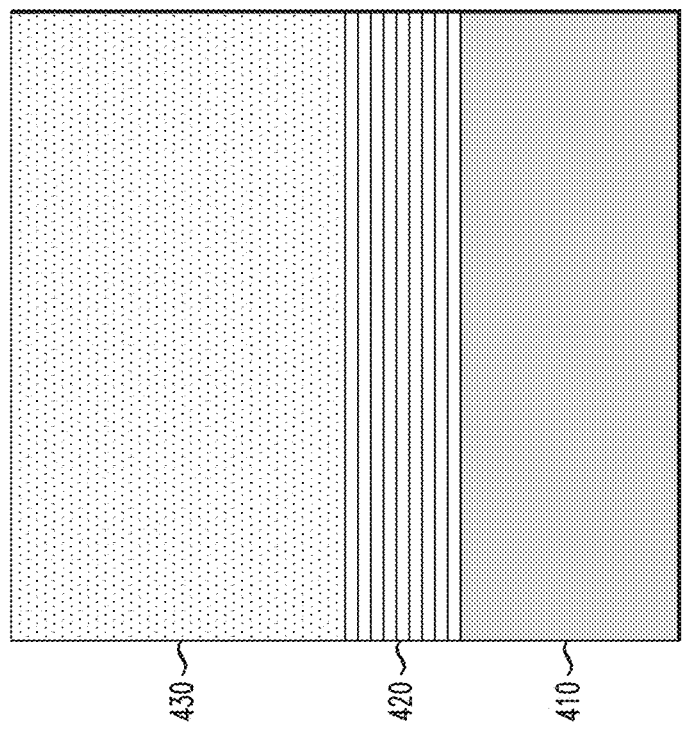

In particular, FIG. 4 is a cross-sectional schematic side view of a semiconductor device 400 at an intermediate stage of fabrication in which the semiconductor device 400 comprises a semiconductor substrate 410 (e.g., semiconductor wafer), a FEOL (front-end-of-line)/MOL (middle-of-line) structure 420 formed on the semiconductor substrate 410, and an ILD layer 430 formed on a substrate comprising substrate layers 410 and 420. While the base semiconductor substrate 410 is illustrated as a generic substrate layer, it is to be understood that the semiconductor substrate 410 may comprise different types of substrate structures and materials.

For example, in one embodiment, the semiconductor substrate 410 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 410 may comprise a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL layer.

The FEOL/MOL structure 420 comprises a FEOL layer formed on the semiconductor substrate 410. The FEOL layer comprises various semiconductor devices and components that are formed in or on the active surface of the semiconductor substrate 410 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 410. In general, FEOL processes typically include preparing the semiconductor substrate 410 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 420 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 420.

In the example embodiment of FIG. 4, the ILD layer 430 is formed as part of a first layer of a BEOL interconnect structure. The ILD layer 430 may comprise any suitable dielectric material that is commonly utilized in BEOL process technologies. For example, the ILD layer 430 can be formed of a dielectric material including, but not limited to, silicon oxide (e.g. $SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The ILD layer 430 may be deposited using known deposition techniques, such as, for example, ALD, PVD, CVD, plasma-enhanced CVD (PECVD), or spin-on deposition. The thickness of the ILD layer 430 will vary depending on the application, and may have a thickness in a range of about 30 nm to about 200 nm, for example.

FIG. 5 is a cross-sectional schematic side view of the semiconductor device of FIG. 4 after etching an opening 430-1 in the ILD layer 430. In the example embodiment of FIG. 5, the opening 430-1 comprises a trench opening with a width W, which defines a "critical dimension" (CD) of a metallic interconnect (e.g., metal wire) which is subsequently formed by filling the trench opening 430-1 with metallic material (the width W is fixed by the CD of the particular fabrication process that is implemented). For illustrative purposes, FIG. 5 shows the use of a single damascene process in which metallic lines (wiring) and metallic vias (vertical interconnects) are separately formed in different ILD layers of a BEOL structure.

In other embodiments, openings can be etched in the ILD layer 430 and filled with metallic material using one of various "dual" damascene patterning techniques known in the art in which trenches and via openings are patterned in the same ILD layer and concurrently filled with metallic material. The dual damascene patterning methods include a "via first" process, a "trench first" process, and a "buried via" process, each of which comprising different sequences for etching the ILD layer 430 to pattern the via openings and trench openings, while concurrently filling the via openings and trench openings with metallic material. The damascene patterning can be implemented using any conventional photolithography and etching process, e.g., forming a photoresist mask and etching the dielectric material of the ILD layer 430 using a dry etch process such as RIE (reactive ion etching), etc. Following the patterning of the ILD layer 430 shown in FIG. 5, any suitable BEOL cleaning techniques can be implemented to remove the etch residues from the exposed surfaces of the ILD layer 430.

Referring back to FIG. 3, a next step in the fabrication process comprises depositing a liner layer over the ILD layer 430 using a dry deposition method (block 304). In one embodiment of the invention, the liner deposition process is performed in the metallization deposition sub-chamber 110 of FIG. 1. In this process, a semiconductor wafer comprising the intermediate semiconductor structure shown in FIG. 5 would be loaded into the wafer input port 160 of the single platform processing chamber 100, and then loaded into the metallization deposition sub-chamber 110 by the wafer handling robot 150. In another embodiment, when the metallization deposition sub-chamber 110 utilizes a wet deposition method to deposit the metallization layer that fills the trenches and via openings of the ILD layer, the liner deposition process of block 304 is performed in a semiconductor processing chamber which is separate from, and not included in, the single platform processing chamber 100 of FIG. 1. The liner deposition process of block 304 is schematically illustrated in FIG. 6.

Figure 6:
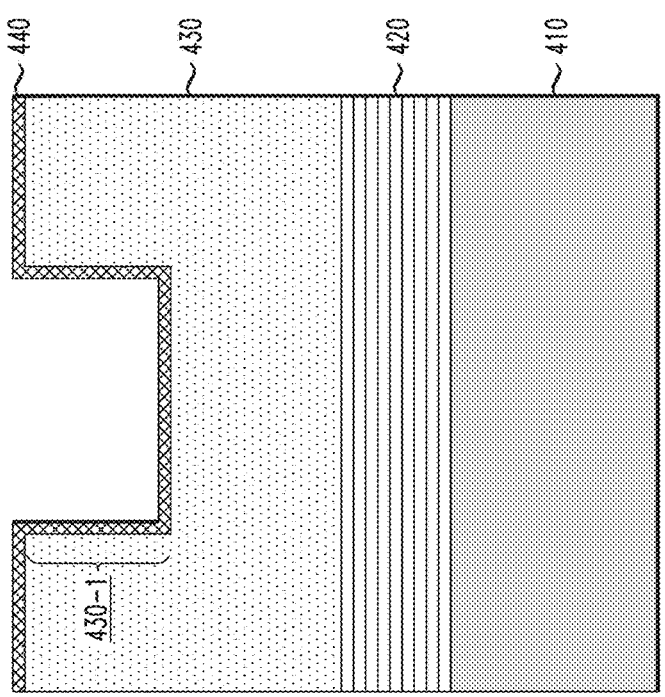

In particular, FIG. 6 is a cross-sectional schematic side view of the semiconductor structure of FIG. 5 after depositing a layer of liner material 440 to line the sidewall and bottom surfaces of the opening 430-1 of the ILD layer 430 with liner material. The liner layer 440 serves as barrier diffusion layer and as an adhesion layer (or seed layer) with regard to the metallic material (e.g., copper material) which is subsequently deposited to fill the opening 430-1 in the ILD layer 430 and form a metallic interconnect structure. In one embodiment, the liner layer 440 is formed of titanium (Ti). In other embodiments, the liner layer 440 may be formed of a single metallic material such as, e.g., tantalum (Ta), aluminum (Al), cobalt (Co), ruthenium (Ru), tungsten (W), iridium (Ir), rhodium (Rh), manganese (Mn), or nickel (Ni), or multiple layers and/or combinations of such metallic materials. In one embodiment, the liner layer 440 comprises a conformal layer of metallic material having thickness in a range of about 1 nm to about 100 nm.

Referring back to FIG. 3, a next step in the fabrication process comprises depositing a layer of metallic material using a dry or wet deposition process to fill the trenches and/or via openings in the ILD layer with metallic material (block 306). In one embodiment of the invention, when a dry deposition method is utilized for the metallization process, the layer of metallic material is deposited in the metallization deposition sub-chamber 110 following the liner deposition. In another embodiment of the invention, when a wet deposition method is utilized for the metallization process, a semiconductor wafer comprising the intermediate semiconductor structure shown in FIG. 6 would be loaded into the wafer input port 160 of the single platform processing chamber 100, and then loaded into the metallization deposition sub-chamber 110 by the wafer handling robot 150.

Following the metallization deposition, an optional metal reflow process can be performed to reflow the deposited layer of metallic material (block 308). If the metal reflow process is to be performed (affirmative decision in block 308), the wafer handling robot 150 removes the semiconductor wafer from the metallization deposition sub-chamber 110 and places the semiconductor wafer in the reflow annealing sub-chamber 120, and a metal reflow process is performed by thermal annealing (block 310). If an additional layer of metallization is to be deposited following the metal reflow process (affirmative decision in block 312), the wafer handling robot 150 removes the semiconductor wafer from the reflow annealing sub-chamber 120 and places the semiconductor wafer back into the metallization deposition sub-chamber 110, wherein another layer of metallic material is deposited to further fill the upper portions of the etched openings in the ILD layer (block 306). Once the metallization and optional metal reflow processes are complete, the wafer handling robot 150 moves the semiconductor wafer into the SCL deposition sub-chamber 130, wherein a stress control layer is deposited over the surface of the semiconductor wafer using a dry or wet deposition process (block 314). The process modules of blocks 306-314 in FIG. 3 are schematically illustrated in FIGS. 7, 8, and 9.

Figure 7:
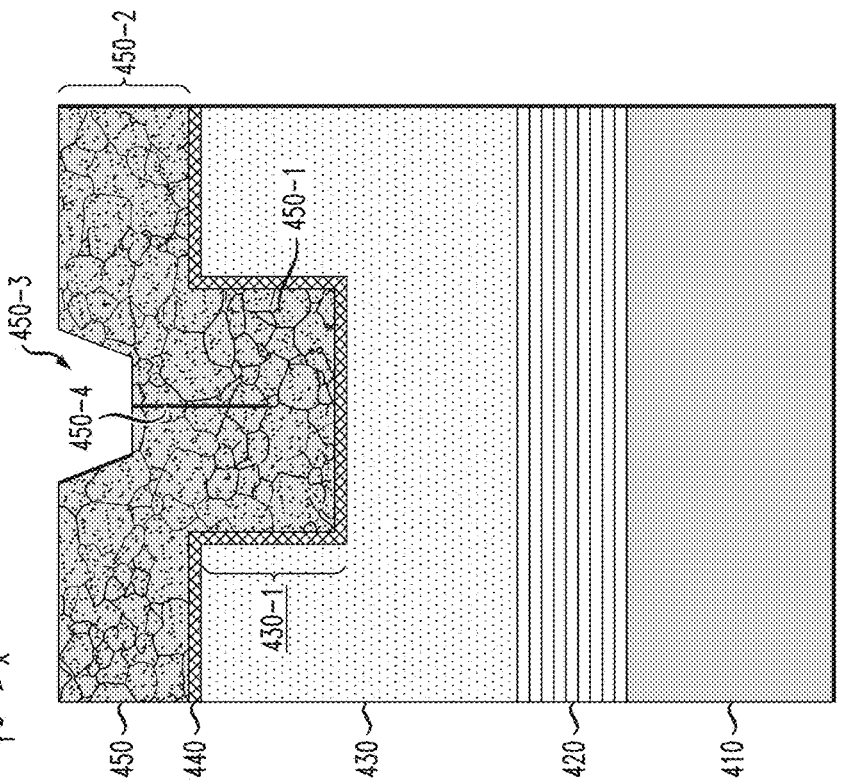

In particular, FIG. 7 is a cross-sectional schematic side view of the semiconductor structure of FIG. 6 after depositing a layer of metallic material 450 to fill the opening 430-1 in the ILD layer 430 with metallic material. As depicted in FIG. 7, the metallic material within the trench opening 430-1 comprises a metal wire 450-1, and the metallic material disposed over the surface of the ILD layer 430 comprises overburden metallic material 450-2, which is subsequently removed. In one embodiment of the invention, the layer of metallic material 450 comprises copper (Cu). In other embodiments, the metallic material 450 can be, for example, Al, W, Co, Ru, Ir, Rh, Ni, or alloys thereof. The layer of metallic material 450 is deposited using known dry deposition techniques such as ALD, PVD or CVD or wet deposition techniques such as electroplating, and electroless plating, etc.

As schematically illustrated in FIG. 7, the layer of metallic material 450 as deposited comprises a polycrystalline microstructure. The polycrystalline microstructure comprises a mosaic of very small single crystals (on the order of micrometer grain sizes), which are randomly distributed with no preferred orientation. In addition, for conformal deposition methods, the layer of metallic material 450 as deposited may have a non-planar surface (e.g., the overburden metallic material 450-2 has recess region 450-3 disposed over the trench 430-1), and the metallic material 450 may have a seam 450-4 (or narrow void) where the conformal metallic material on the sidewalls of the trench 430-1 meet at the end of the metal deposition process. These features can be removed by a metal reflow process.

Figure 8:
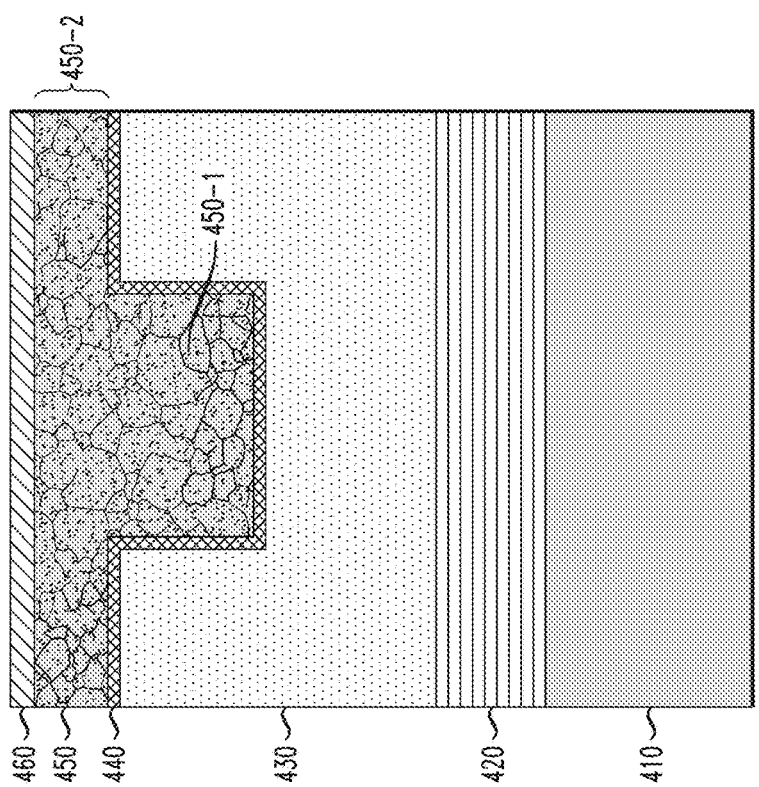
Figure 9:
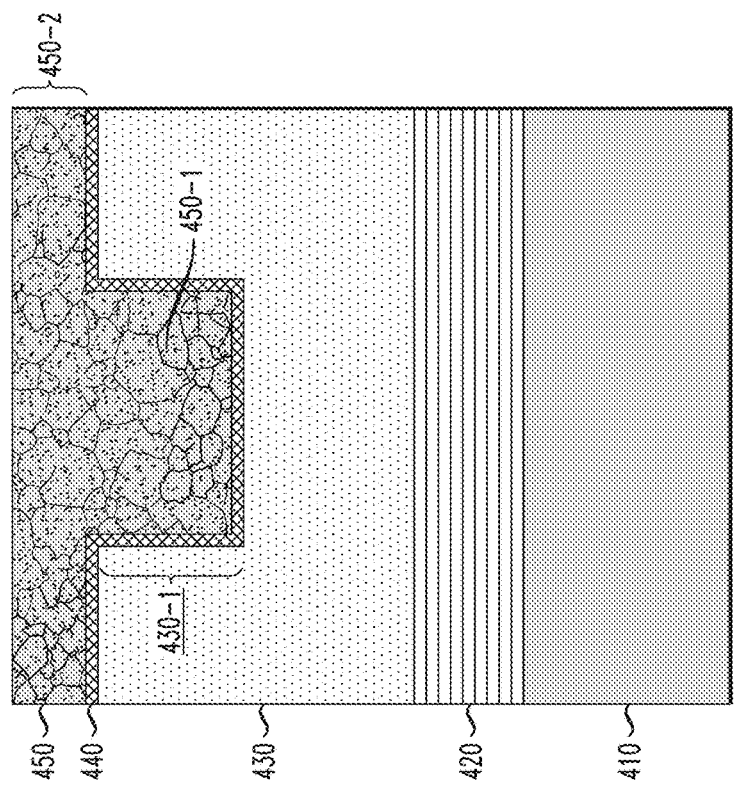

For example, FIG. 8 is a cross-sectional schematic side view of the semiconductor structure of FIG. 7 after performing a thermal anneal process to reflow the layer of metallic material 450. In one embodiment of the invention, the metal reflow process is performing using a thermal annealing process in a suitable gas atmosphere (e.g., mixture of hydrogen and nitrogen) and at a relatively low temperature (e.g., about 300 degrees Celsius) and for a period of time that is sufficient to effectively melt the metallic material 450 and allow the metallic material to reflow. As a result of the metal reflow process, as schematically illustrated in FIG. 8, the surface of the layer of metallic material 450 becomes more planar, the seam 450-4 (or narrow void) is removed, and the thickness of the overburden metallic material 450-2 decreases as a result of the reflowing metallic material filling the recess region 450-3 and other voids that may exist in the metallic material 450 after the metal deposition. The metal reflow process allows the reflowed metallic material to reflow into and within the trench opening 430-1 (and high aspect ratio via openings that may exist in the ILD layer 430) to better fill such features.

Next, FIG. 9 is a cross-sectional schematic side view of the semiconductor structure of FIG. 8 after depositing a stress control layer 460 on the free surface of the layer of metallic material 450. In one embodiment, the stress control layer 460 is deposited in the SCL deposition sub-chamber 130 (FIG. 1) using a dry deposition method (e.g., ALD, CVD, PVD, etc.). The stress control layer 460 may be formed of one or more materials, including, but not limited to, tantalum (Ta), tantalum nitride (TaN), titanium (Ti), titanium nitride (TiN), tungsten (W), tungsten nitride (WN), cobalt (Co), cobalt tungsten phosphide (CoWP), ruthenium (Ru), ruthenium nitride (RuN), ruthenium (Ru), ruthenium nitride (RuN), iridium (Ir), rhodium (Rh), manganese (Mn), or nickel (Ni), or alloys of such materials. In another embodiment, the SCL deposition sub-chamber 130 implements a wet deposition method such as electroplating, electroless plating, etc., to form the stress control layer 460. The stress control layer 460 is formed with a thickness that may range between 1 nm and 100 nm.

Referring back to FIG. 3, following the deposition of the stress control layer (block 314), a next step in the fabrication process comprises performing a controlled thermal anneal using a programmed hot plate to modulate the microstructure of the metallization layer (block 316). In one embodiment, the controlled thermal anneal process (block 316) is performed in the microstructure modulation annealing sub-chamber 140 of the single platform processing chamber 100 of FIG. 1. In particular, after depositing the stress control layer, the wafer handling robot 150 removes the semiconductor wafer from the SCL deposition sub-chamber 130 and places the semiconductor wafer onto a programmable hot plate device in the microstructure module annealing sub-chamber 140, wherein the metallization layer is subjected to a controlled thermal anneal heat treatment using the programmable hot plate by programmatically controlling the temperature settings of the programmable hot plot according to a programmed anneal cycle. As noted above, the thermal annealing process implemented in the microstructure modulation annealing sub-chamber 140 is configured to convert the polycrystalline microstructure of the metallic material into a different microstructure comprising larger grains with a given grain direction. Furthermore, as noted above, the microstructure modulation of the metallic material is performed in-situ, without an air break, and at a controlled period time following the deposition of the stress control layer. The microstructure modulation process of block 316 is schematically illustrated in FIG. 10.

In particular, FIG. 10 is a cross-sectional schematic side view of the semiconductor structure of FIG. 9 after applying a controlled thermal annealing process to cause recrystallization and grain growth of the layer of metallic material 450. The controlled thermal annealing process converts the microstructure of the layer of metallic material 450 from a polycrystalline microstructure (as schematically shown in FIG. 9), to a microstructure having large grains with grain boundaries 450A orientated in a given direction, as schematically shown in FIG. 10. The polycrystalline microstructure of the layer of metallic material 450 shown in FIG. 9 comprises many crystallites (or grains) of varying size and orientation, and with random texture and no grain direction, which (as noted above) tends to decrease the electrical conductivity of the metallic material, and enhance electromigration due to grain boundary diffusion of electrons. Accordingly, to further reduce the electrical resistance of the metal wiring, in one embodiment of the invention, the layer of metallic material 450 is subjected to a controlled heat treatment with the stress control layer 460 disposed on the surface of the layer of metallic material 450 to convert the polycrystalline microstructure of the metallic material 450 into "bamboo" or "columnar" microstructure, having large elongated grains that extend in a particular direction.

In particular, as shown in FIG. 10, the overburden metallic material 450-2 and the portion of the metallic material 450-1 (which forms a metal line) within the trench 430-1 of the ILD layer 430 comprise large grains that are separated by grain boundaries 450A which extend in substantially the same direction (e.g., in a substantially vertical direction), providing a columnar or bamboo microstructure. The example microstructure shown in FIG. 10 serves to minimize electromigration as the grain boundaries 450A extend in a substantially vertical direction (Z-direction) which is essentially perpendicular to a length direction (which extends in the Y-direction) in which electrical current would flow within the metal line 450-1 during operation.

In one embodiment, as shown in FIG. 10, following the microstructure modulation anneal process, an average grain size of the microstructure of the annealed metallic material 450-1 is greater than an average size of the polycrystalline microstructure of the metallic material 450 prior to the microstructure modulation anneal process. It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N). In one embodiment, the average grain size of the metallic material 450-1 in the trench 430-1 in the "length" direction (Y-direction) of the trench 430-1 (perpendicular to the width W) is greater than a critical dimension (e.g., width W1) of the metal line 450-2.

Referring back to FIG. 3, following the completion of the microstructure modulation thermal anneal process (block 316), the stress control layer is removed (block 318), and the semiconductor wafer is planarized (e.g., by chemical mechanical planarization (CMP)) to remove the overburden metallic and liner material down to the ILD layer (block 320). A capping layer is then deposited over the planarized surface of the semiconductor wafer (block 322), and the entire process of FIG. 3 can be repeated to form a next level (e.g., ILD and metallization) of the BEOL structure. In one embodiment of the invention, following the microstructure modulation thermal anneal process (block 316), the wafer handling robot 150 removes the semiconductor wafer from the microstructure modulation annealing sub-chamber 140 and places the semiconductor wafer in the wafer output port 170. The semiconductor wafer is then removed from the single platform processing chamber 100 and placed in one or more separate processing chambers to perform the process steps of blocks 318, 320 and 322, which are schematically illustrated in FIGS. 11 and 12.

In particular, FIG. 11 is a cross-sectional schematic side view of the semiconductor structure of FIG. 10 after removing the stress control layer 460 and planarizing the surface of the semiconductor structure down to the ILD layer 430 resulting in the formation of a target metal interconnect structure comprising the metal line 450-1 in the ILD layer 430. In one embodiment, the planarizing process is performed using CMP to remove the stress control layer 460, the overburden metallic material 450-2 and the overburden portion of the liner layer 440, resulting in the semiconductor structure shown in FIG. 11. In another embodiment, the stress control layer 460 can be removed using a separate etch process. As shown in FIG. 11, the resulting metal line 450-1 comprises a columnar/bamboo microstructure with grain boundaries 450A that define relatively large crystallites.

Figure 12:
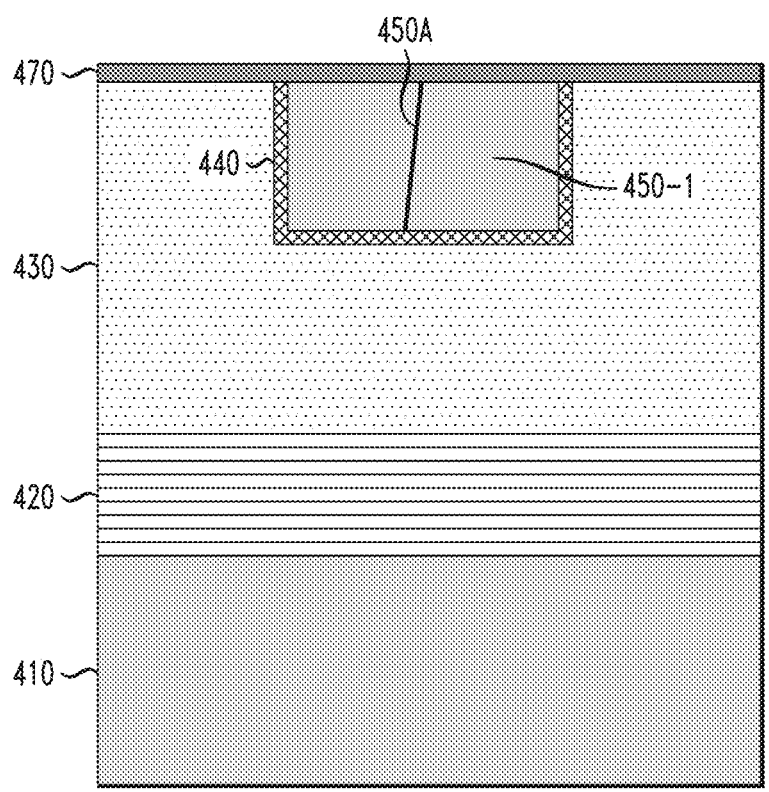

Next, FIG. 12 is a cross-sectional schematic side view of the semiconductor structure of FIG. 11 after depositing a layer of insulating material on the planarized surface of the ILD layer 430 to form a capping layer 470. As shown in FIG. 12, the capping layer 470 is formed over the surface of the ILD layer 430 and the exposed surface of the metal interconnect structure 450-1. In one embodiment, the capping layer 470 is formed of a dielectric material which is non-reactive with the metallic material that is used to form the metal interconnect structure 450-1 and other metal interconnect structures that are formed in ILD layer 430. The capping 470 layer serves to insulate exposed surface portions of the metallization structures formed in the ILD layer 430 from the dielectric material of another ILD layer formed on top of the ILD layer 430. For example, in a BEOL structure using copper metallization, the dielectric capping layer 470 serves to improve interconnect reliability by preventing oxidation of the copper metallization and preventing copper material of the metallization structures from diffusing into the dielectric material of the ILD layer.

The dielectric capping layer 470 could be formed of silicon nitride (SiN), silicon carbide (SiC), silicon carbon nitride (SiCN), hydrogenated silicon carbide (SiCH), or a multilayer stack comprising the same or different types of dielectric materials, etc., and deposited using standard deposition techniques, for example, chemical vapor deposition. The capping layer 470 can be formed with a thickness in a range from about 2 nm to about 60 nm. On the other hand, if the metallic material used to form the metallization structures in the ILD layer 430 comprises tungsten, for example, another ILD layer could be deposited directly on the ILD layer 430 (without having to form the capping layer 470) as tungsten is not reactive with typical dielectric materials that are used to form ILD layers.

It is to be understood that the methods discussed herein for fabricating low resistance metallic interconnect structures (e.g., copper BEOL interconnect structures) can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
  forming a dielectric layer on a substrate;
  patterning the dielectric layer to form an opening in the dielectric layer;
  depositing a layer of metallic material on the dielectric layer to fill the opening with metallic material;
  forming a stress control layer on the layer of metallic material; and
  performing a thermal anneal process to modulate a microstructure of the deposited layer of metallic material from a first microstructure to a second microstructure while the stress control layer is disposed on the layer of metallic material;
  wherein the thermal anneal process is performed using a programmable hot plate which is programmed to perform a controlled thermal anneal cycle with active heating and active cooling periods; and
  wherein the thermal anneal process is performed without an air break between the steps of forming the stress control layer and performing the thermal anneal process.

2. The method of claim 1, wherein the controlled thermal anneal cycle is performed over a period of time ranging from about 30 seconds to about 5 hours.

3. The method of claim 1, wherein the controlled thermal anneal cycle is performed over a temperature setting of the programmable hot plate from about 0 degrees Celsius to about 800 degrees Celsius.

4. The method of claim 1, wherein the controlled thermal anneal cycle comprises at least one ramp-up heating period in which a temperature setting of the programmable hot plate increases at a rate of about 10 degrees Celsius per minute, or greater.

5. The method of claim 1, wherein the controlled thermal anneal cycle comprises at least one ramp-down cooling period in which a temperature setting of the programmable hot plate decreases at a rate of about 2 degrees Celsius per minute or greater.

6. The method of claim 1, wherein the controlled thermal anneal cycle comprises at least one soaking period in which a temperature setting of the programmable hot plate is maintained constant for a period of time at a temperature level which is below a critical temperature of the layer of metallic material at which stress relaxation of the metallic material occurs during a heating period of the controlled thermal anneal cycle.

7. The method of claim 1, wherein the controlled thermal anneal cycle is performed in a gas atmosphere which comprises at least one of nitrogen, hydrogen, and helium.

8. The method of claim 1, wherein the stress control layer comprises at least one of tantalum, tantalum nitride, titanium, titanium nitride, tungsten, tungsten nitride, cobalt, cobalt tungsten phosphide, ruthenium, ruthenium nitride, ruthenium, ruthenium nitride, iridium, rhodium, manganese, nickel, and alloys of such materials.

9. The method of claim 1, wherein the layer of metallic material comprises at least one of copper, aluminum, tungsten, cobalt, ruthenium, iridium, rhodium, nickel, and alloys of such materials.

10. The method of claim 1, comprising performing a wet deposition process to form the stress control layer on the layer of metallic material.

11. The method of claim 1, comprising performing a dry deposition process to form the stress control layer on the layer of metallic material.

12. The method of claim 1, further comprising performing a furnace thermal anneal process to reflow the layer of metallic material prior to forming the stress control layer on the reflowed layer of metallic material.

13. The method of claim 1, wherein the first microstructure comprises a polycrystalline microstructure and wherein the second microstructure comprises an average grain size which is greater than an average grain size of the polycrystalline microstructure.

14. The method of claim 1, wherein the dielectric layer comprises an interlevel dielectric layer of a back-end-of-line structure formed on the semiconductor substrate.

15. A method, comprising:
forming wafer comprising a dielectric layer formed on an upper surface of a wafer substrate, wherein the dielectric layer comprises an opening etched in a surface of the dielectric layer;
inputting the wafer into a single platform semiconductor processing chamber which is configured to process the wafer, the single platform semiconductor processing chamber comprising a first sub-chamber, a second sub-chamber, and a third sub-chamber;
depositing a layer of metallic material to fill the opening and cover the surface of the dielectric layer with the metallic material, in the first sub-chamber;
depositing a stress control layer on the layer of metallic material, in the second sub-chamber; and
performing a thermal anneal process in the third sub-chamber using a programmable hot plate to modulate a microstructure of the layer of metallic material from a first microstructure to a second microstructure while the stress control layer is disposed on the layer of metallic material, wherein the programmable hot plate is programmed to perform a controlled thermal anneal cycle with active heating and active cooling stages;
wherein the thermal anneal process is performed without an air break between the steps of depositing the stress control layer and performing the thermal anneal process.

16. The method of claim 15, further comprising performing a furnace thermal anneal process in a fourth sub-chamber of the single platform semiconductor processing chamber, wherein the furnace thermal anneal process is performed to reflow the layer of metallic material prior to depositing the stress control layer on the reflowed layer of metallic material in the second sub-chamber.

17. The method of claim 15, wherein the controlled thermal anneal cycle is performed over a period of time ranging from about 30 seconds to about 5 hours.

18. The method of claim 15, wherein the controlled thermal anneal cycle is performed over a temperature setting of the programmable hot plate from about 0 degrees Celsius to about 800 degrees Celsius.

19. The method of claim 15, wherein the controlled thermal anneal cycle comprises:
at least one ramp-up heating period in which a temperature setting of the programmable hot plate increases at a rate of about 10 degrees Celsius per minute, or greater;
at least one ramp-down cooling period in which a temperature setting of the programmable hot plate decreases at a rate of about 2 degrees Celsius per minute, or greater; and
at least one soaking period in which a temperature setting of the programmable hot plate is maintained constant for a period of time at a temperature level which is below a critical temperature of the layer of metallic material at which stress relaxation of the metallic material occurs during a heating period of the controlled thermal anneal cycle.

20. The method of claim 15, wherein:
the stress control layer comprises at least one of tantalum, tantalum nitride, titanium, titanium nitride, tungsten, tungsten nitride, cobalt, cobalt tungsten phosphide, ruthenium, ruthenium nitride, ruthenium, ruthenium nitride, iridium, rhodium, manganese, nickel, and alloys of such materials; and
the layer of metallic material comprises at least one of copper, aluminum, tungsten, cobalt, ruthenium, iridium, rhodium, nickel, and alloys of such materials.

* * * * *